United States Patent [19]
Young et al.

[11] Patent Number: 6,107,826
[45] Date of Patent: Aug. 22, 2000

[54] INTERCONNECT STRUCTURE FOR FPGA WITH CONFIGURABLE DELAY LOCKED LOOP

[75] Inventors: Steven P. Young, San Jose; Trevor J. Bauer, Campbell, both of Calif.

[73] Assignee: Xilinx, Inc., San Jose, Calif.

[21] Appl. No.: 09/136,461

[22] Filed: Aug. 19, 1998

[51] Int. Cl.[7] .............................................. H03K 19/177
[52] U.S. Cl. ................. 326/41; 326/41; 326/40; 326/39; 326/38; 326/37; 326/47; 326/101
[58] Field of Search ................................ 326/38, 39, 40, 326/41, 47, 101

[56] References Cited

U.S. PATENT DOCUMENTS

| | | | |
|---|---|---|---|
| 5,646,564 | 7/1997 | Erickson et al. | 327/158 |
| 5,744,991 | 4/1998 | Jefferson et al. | 327/158 |
| 5,771,264 | 6/1998 | Lane | 375/376 |
| 5,825,197 | 10/1998 | Lane et al. | 326/10 |

OTHER PUBLICATIONS

Microelectronics Group, Lucent Techologies, Inc., Preliminary Data Sheet, May 1998, pp. 69–80, ORCA OR3Cxx (5 V), and OR3Txxx (3.3 V) Series Field–Programmable Gate Arrays, available from Microelectronics Group, Lucent Technologies, Inc., 555 Union Boulevard, Room 30L–15P–BA, Allentown, PA 18103.

"Actel ES Family Digital Phase Lock Loop Usage", by Joe Landry, Sep. 17, 1996, pp. 1–5, available from Actel Corporation, 955 East Arques Avenue, Sunnyvale, CA 94086–4533.

"Actel's Reprogrammable SPGAs", Oct. 10, 1996, pp. 1–8, available from Actel Corporation, 955 East Arques Avenue, Sunnyvale, CA 94086–4533.

*Primary Examiner*—Michael Tokar
*Assistant Examiner*—Vibol Tan
*Attorney, Agent, or Firm*—E. Eric Hoffman, Esq.; Bever, Hoffman & Harms; Lois D. Cartier

[57] ABSTRACT

A field programmable gate array (FPGA) is provided that includes a plurality of pads and a plurality of delay locked loops (DLLs). Programmable connections enable any one of the DLLs to have multiple pads as inputs. Programmable connections also enable the DLLs to be selectively connected to one another. Programmable connections further enable the pads to be selectively connected to general interconnect circuitry or global clock drivers of the FPGA. Programmable connections are also provided for selectively connecting the DLLs to the global clock drivers. This FPGA structure enables the pads to be configured to receive either clock or non-clock signals. This structure also enables the FPGA to operate as a clock mirror, and to generate one clock signal from another clock signal on the FPGA.

19 Claims, 3 Drawing Sheets

INTERCONNECT STRUCTURE FOR FPGA WITH CONFIGURABLE DELAY LOCKED LOOP

CROSS-REFERENCE TO RELATED APPLICATIONS

This application relates to the following commonly assigned co-pending U.S. patent applications:
1. Ser. No. 08/806,997 invented by Steven P. Young et al, entitled "FPGA Repeatable Interconnect Structure with Hierarchical Interconnect Lines", and
2. Ser. No. 09/102,740 invented by Joseph H. Hassoun et al, entitled "Delay Locked Loop with Clock Phase Shifter", which are incorporated herein by reference.

FIELD OF THE INVENTION

The present invention relates to an improved structure for a field programmable gate array (FPGA) having a programmable delay locked loop (DLL).

BACKGROUND OF THE INVENTION

FIG. 1 is a block diagram of a portion of a conventional integrated circuit 100, which includes pad 101, delay locked loop (DLL) 102, global clock buffer 103, and global clock routing network 104. Other well-known elements of integrated circuit 100 are not illustrated in FIG. 1 for purposes of clarity. Reference clock signal REF_CLK is applied to pad 101. The reference clock signal REF_CLK is routed to DLL 102 as an input clock signal CLK_IN. The CLK_IN signal is used to clock data into integrated circuit 100. In response to the CLK_IN signal, DLL 102 generates an output clock signal CLK_OUT, which is provided to global clock driver 103. The output clock signal CLK_OUT is transmitted through global clock driver 103 to global clock routing network 104. Global clock routing network 104 transmits the output clock signal CLK_OUT throughout integrated circuit 100 with minimum skew and a significant delay. A feedback clock signal CLK_FB is provided at the end of the global clock routing network 104. The CLK_FB signal has a delay that is similar to the delay of the output clock signal CLK_OUT as it is routed to other loads of the integrated circuit. The feedback clock signal CLK_FB is used to clock data values throughout integrated circuit 100 (e.g., to clock data values out of the integrated circuit).

The feedback clock signal CLK_FB is also provided to DLL 102. In response to the feedback clock signal CLK-FB, DLL 102 introduces a delay in the output clock signal CLK_OUT. DLL 102 controls the amount of delay introduced, such that the feedback clock signal CLK_FB is synchronized with the input clock signal CLK_IN. By synchronizing the feedback clock signal CLK_FB with the input clock signal CLK_IN, the data clocked into integrated circuit 100 (by input clock signal CLK_IN) is synchronized with the data clocked out of integrated circuit 100 (by feedback clock signal CLK_FB). As a result, clock skew is eliminated, thereby eliminating signal hold time requirements, without delaying the input signals.

Integrated circuit 100 requires that pad 101 be dedicated to receiving the input clock signal CLK_IN. Integrated circuit 100 also requires that DLL 102 receives the input clock signal CLK_IN from pad 101. In addition, DLL 102 must receive the feedback clock signal CLK_FB from global clock routing network 104. As a result, the flexibility of integrated circuit 100 is undesirably limited.

It would therefore be desirable to have an integrated circuit with an improved DLL interconnect structure. It would further be desirable if such an improved DLL interconnect structure could be implemented on a field programmable gate array (FPGA).

SUMMARY OF THE INVENTION

Accordingly, the present invention provides an FPGA that includes at least one delay locked loop (DLL) and at least one associated pad. In a particular embodiment, the FPGA includes a first DLL, a second DLL, a first pad, and a second pad. Programmable connections are provided to enable either of the first and second pads to be selectively connected to either of the first and second DLLs. Programmable connections are also provided to enable the first and second DLLs to be selectively connected to each other. Additional programmable connections enable the first and second pads to be selectively connected to general interconnect circuitry or global clock drivers of the FPGA. Programmable connections are also provided for selectively connecting output terminals of the first and second DLLs to the global clock drivers.

The FPGA structure in accordance with this embodiment advantageously enables the first and second pads to be configured to receive either clock or non-clock signals. A received clock signal can be routed to the first or second DLL or to the first or second global clock driver. A received non-clock signal can be routed directly to the general interconnect circuitry. The ability to configure the FPGA in this manner enables the first and second pads to be used in a flexible and efficient manner.

This FPGA structure also enables the FPGA to be configured to operate as a clock mirror circuit. A clock mirror circuit, for example, allows a relatively weak clock signal to be buffered without inserting skew in the clock path. To create this structure, a reference clock signal is routed from the first pad to the first DLL. In response to the reference clock signal, the first DLL generates an output clock signal, which is routed through an output driver of the FPGA to a printed circuit board. The output clock signal is routed to other devices on the printed circuit board, as well as to the second pad of the FPGA. From the second pad of the FPGA, the output clock signal is routed to the first DLL as a feedback clock signal. In response, the first DLL introduces a delay to the output clock signal, thereby causing the output clock signal received at the second pad to match the reference clock signal received at the first pad. The FPGA thereby replicates the reference clock signal for use by other circuits coupled to the printed circuit board, while only loading the reference clock signal with a single pad.

The same FPGA configuration that is used to generate a clock mirror circuit can also be used to generate a clock doubler, clock divider, or phase-shifter providing a clock signal to an external pad. All of these circuits are all well-known in the art and therefore are not described herein.

This FPGA structure also enables the FPGA to generate one clock signal from another clock signal on the FPGA. For example, a reference clock signal can be routed from the first pad to the first DLL, which generates a first output clock signal having a first selected phase and frequency relationship with respect to the reference clock signal. This first output clock signal is then routed from the first DLL to the second DLL. In response to the first output clock signal, the second DLL generates a second output clock signal having a second selected phase and frequency relationship with respect to the first output clock signal. By using the first and second DLLs in this manner, the second output clock signal may have a phase and frequency relationship with respect to the reference clock signal that would have been unobtainable with either one of the DLLs alone. For example, the first clock signal can have twice the frequency of the reference clock signal, while the second clock signal can have twice the frequency of the first clock signal, thereby causing the second clock signal to have four times the frequency of the reference clock signal.

The present invention will be more fully understood in view of the following description and drawings.

DETAILED DESCRIPTION OF THE DRAWINGS

Figure 2:
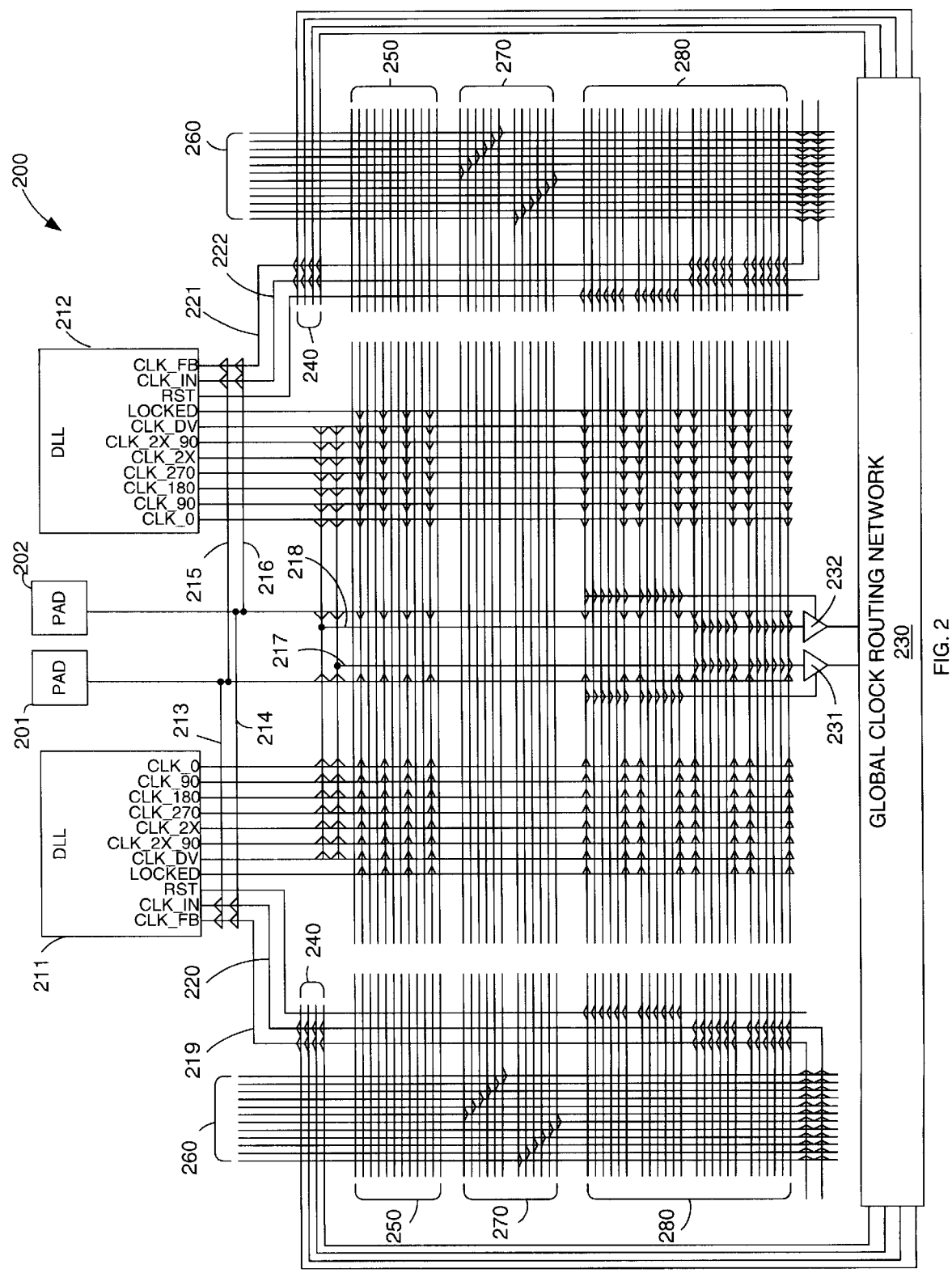
FIG. 2 is a block diagram of a portion of an FPGA in accordance with one embodiment of the present invention.

FIG. 2 is a block diagram of a portion of an FPGA 200 in accordance with one embodiment of the present invention. The illustrated portion of FPGA 200 includes pads 201–202, delay locked loops (DLLs) 211–212, traces 213–222, global clock routing network 230, global clock drivers 231–232, global clock lines 240, horizontal long lines 250, vertical long lines 260, backbone hex lines 270, and general hex lines 280. Collectively, horizontal long lines 250, vertical long lines 260, backbone hex lines 270, and general hex lines 280 are referred to as the general interconnect circuitry of FPGA 200. Programmable interconnect points (PIPs), which can be selectively programmed to provide connections between the various routing lines, are illustrated as small open triangles in FIG. 2. In general, the apex of each triangle points in the direction that a signal is driven if the PIP is programmed.

It is understood that FPGA 200 includes other elements, such as input/output blocks (IOBs), programmable interconnect resources, and configurable logic blocks (CLBs) that are not illustrated in FIG. 2 for purposes of clarity. These other elements of FPGA 200 are described in more detail by Young et al in commonly owned, co-pending U.S. patent application Ser. No. 08/806,997, referenced above.

It is also understood that the circuitry illustrated in FIG. 2 generally represents circuitry that is present on one half of FPGA 200. In the described embodiment, the other half of FPGA 200 includes circuitry substantially identical to the circuitry illustrated in FIG. 2. Thus, in the described embodiment, FPGA 200 includes four DLLs (one located at each corner of the FPGA) and four global clock drivers.

Horizontal long lines 250, backbone hex lines 270, and general hex lines 280 are shown as discontinuous segments. However, it is understood that horizontal long lines 250 are continuous across the width of FPGA 200, while in this embodiment each of backbone hex lines 270 and each of general hex lines 280 spans six gaps between adjacent configurable logic blocks (CLBs). PIPs (not shown) are provided for programmably connecting horizontal long lines 250, backbone hex lines 270, and general hex lines 280. A detailed description of global clock routing network 230, global clock lines 240, horizontal long lines 250, vertical long lines 260, and general hex lines 280 is provided by Young et al in U.S. patent application Ser. No. 08/806,997, referenced above. Backbone hex lines 270 differ from general hex lines 280 in that backbone hex lines 270 only have programmable connections to vertical long lines 260 (and to other backbone hex lines 270, which connections are not shown).

Pad 201 is connected to traces 213 and 215 as illustrated. Similarly, pad 202 is connected to traces 214 and 216. PIPs are provided to enable trace 213 to be programmably connected to an input clock (CLK_IN) terminal or a clock feedback (CLK_FB) input terminal of DLL 211. PIPs are also provided to enable trace 214 to be programmably connected to the CLK_IN terminal or the CLK_FB terminal of DLL 211. Similarly, PIPs are provided to enable traces 215 and 216 to be programmably connected to the CLK_IN or CLK_FB input terminals of DLL 212. As described in more detail below, delay elements (not shown in FIG. 2) can be inserted between these PIPs and DLLs 211–212 to optimize circuit performance. The delays of traces 213–216 are matched (i.e., equal). By appropriately programming the PIPs, pad 201 can be connected to the CLK_IN terminal of DLL 211, the CLK_IN terminal of DLL 212, the CLK_FB terminal of DLL 211, or the CLK_FB terminal of DLL 212. Similarly, pad 202 can be programmably connected to the CLK_IN terminal of DLL 211, the CLK_IN terminal of DLL 212, the CLK_FB terminal of DLL 211, or the CLK_FB terminal of DLL 212. In the described embodiment, the PIPs that provide the programmable connections to traces 213–216 are provided by dedicated block RAM tiles present in FPGA 200. In other embodiments, the PIPs providing programmable connections to traces 213–216 are provided by other circuitry of FPGA 200.

Pads 201 and 202 are also connected to PIPs that can be selectively programmed to couple either of these pads 201–202 to either of traces 217–218. Traces 217 and 218 are connected to the input terminals of global clock drivers 231 and 232, respectively. Thus, by programming the PIPs in the appropriate manner, a clock signal received on pad 201 can be used to drive global clock driver 231 or global clock driver 232. Similarly, a clock signal received on pad 202 can be used to drive global clock driver 231 or global clock driver 232.

Note that pads 201 and 202 are also connected to PIPs that can be selectively programmed to connect either of these pads to horizontal long lines 250 or to general hex lines 280. PIPs are provided to allow general hex lines 280 to be programmably connected to the control terminals of global clock drivers 231 and 232. As a result, pads 201 and 202 can be connected to the control terminals of global clock drivers 231 and 232.

As described above, pads 201 and 202 can be programmably connected to DLLs 211–212, global clock drivers 231–232, or the general interconnect circuitry of FPGA 200 (e.g., horizontal long lines 250 and general hex lines 280). As a result, pads 201 and 202 can be configured to receive either clock signals or non-clock signals (e.g., data, address, or control signals). Enabling pads 201 and 202 to receive either clock signals or non-clock signals advantageously allows more flexibility in the configuration of FPGA 200.

Turning now to DLLs 211 and 212, it is noted that DLLs 211 and 212 are identical in the described embodiment. Consequently, only DLL 211 is described in detail. In other embodiments, DLLs 211 and 212 can be different circuits that are programmable to provide different clock signals. DLL 211 includes input terminals for receiving an input clock signal CLK_IN, a feedback clock signal CLK_FB, and a reset signal RST. DLL 211 further includes output terminals for providing output clock signals CLK_0, CLK_90, CLK_180, CLK_270, CLK_2X, CLK_2X_90, CLK_DV, and a control signal LOCKED. In the present specification, these input and output terminals are defined by the signals that they carry. For example, the terminal that drives the output clock signal CLK_180 is referred to as the output terminal CLK_180.

In general, DLL 211 receives the input clock signal CLK_IN, and in response, generates an output clock signal. The particular output clock signal generated by DLL 211 is during the during the configuration of FPGA 200. The output clock signals are defined with respect to the input clock signal CLK_IN. Thus, output clock signal CLK_0 is equal to the CLK_IN signal phase-shifted by 0 degrees (i.e., unshifted). Similarly, output clock signals CLK_90, CLK 180, and CLK_270 are equal to the CLK_IN signal phase shifted by 90, 180, and 270 degrees, respectively. The output clock signal CLK_2X has a frequency two times the frequency of the CLK_IN signal. The output clock signal CLK_2X_90 has a frequency two times the CLK_IN signal, and is phase-shifted 90 degrees with respect to the CLK_IN signal. The output clock signal CLK_DV is a divided version of the CLK_IN signal. For example, DLL 211 can be configured such that higher-frequency input clock signals (f>60 MHz) can be divided by 2, 4, 8, or 16, and lower-frequency input clock signals (f>90 MHz) can be divided by 1.5, 2, 2.5, 3, 4, 5, 8, or 16. In other embodiments, other frequency divisions are possible.

As mentioned above, DLL 211 is configured to generate one of the above-described output clock signals. In general, the output clock signal is distributed throughout FPGA 200 on a low-skew clock distribution path that introduces a delay to this output clock signal. The delayed output clock signal is provided to many loads of the FPGA, including flip-flops and latches in configurable logic blocks (CLBs), input/output blocks (IOBs), and the CLK_FB input terminal of DLL 211 (as feedback clock signal CLK_FB).

DLL 211 is controlled to introduce a delay in the output clock signal generated by DLL 211. The delay introduced by DLL 211 is selected such that the CLK_FB signal exhibits the desired phase and frequency relationship with respect to the input clock signal CLK_IN. For example, if DLL 211 is configured to generate the CLK_0 output clock signal, then DLL 211 delays the CLK_0 output clock signal by an amount which causes the rising edges of the CLK_FB signal to be synchronized with the rising edges of input clock signal CLK_IN. Similarly, if DLL 211 is configured to generate the CLK_90 output clock signal, then DLL 211 delays the CLK_90 output clock signal by an amount which causes the rising edges of the CLK FB signal to be exactly 90 degrees out of phase with the rising edges of the input clock signal CLK_IN. In other embodiments, DLL 211 can be modified to operate in response to the falling edges of the CLK_IN and CLK_FB signals.

DLL 211 asserts the LOCKED control signal when the feedback clock signal CLK_FB has the desired phase and frequency relationship with respect to the input clock signal CLK_IN. The internal circuitry and operation of DLL 211 is described in more detail by Hassoun et al in commonly owned, co-pending U.S. patent application Ser. No. 09/102,740, referenced above.

The various connections to DLLs 211 and 212 will now be described. As described above, the CLK_IN and CLK_FB input terminals of DLLs 211 and 212 can be connected to pads 201 and 202 by programming the appropriate PIPs. In addition, PIPs are provided for selectively coupling the CLK_IN and CLK_FB input terminals of DLLs 211 and 212 to global clock lines 240, general hex lines 280, or vertical long lines 260. Advantageously, the CLK_IN and CLK_FB input signals can be provided to DLLs 211 and 212 from a large number of different sources. PIPs are also provided for selectively coupling the RST input terminals of DLLs 211 and 212 to general hex lines 280.

In addition, PIPs are provided for selectively coupling the CLK_0, CLK_90, CLK_180, CLK_270, CLK_2X and CLK_2X_90 output terminals of DLLs 211 and 212 to traces 217–218 (i.e., the input terminals of global clock drivers 231–232), to horizontal long lines 250, and to general hex lines 280.

The output terminals of global clock drivers 231 and 232 are connected to global clock routing network 230. Global clock routing network 230 is designed to distribute clock signals received from global clock drivers 231 and 232 throughout FPGA 200 with minimum skew (i.e., with substantially equal delay of the clock signal to all loads on the clock routing network). The distributed clock signals are routed along various clock distribution paths, which include global clock lines 240. The distributed clock signals undergo an appreciable delay when routed through global clock routing network 230. Traces 219–222, when programmably connected to global clock lines 240, receive a clock signal representative of the delayed clock signal provided at the end of global clock routing network 230.

Figure 3:
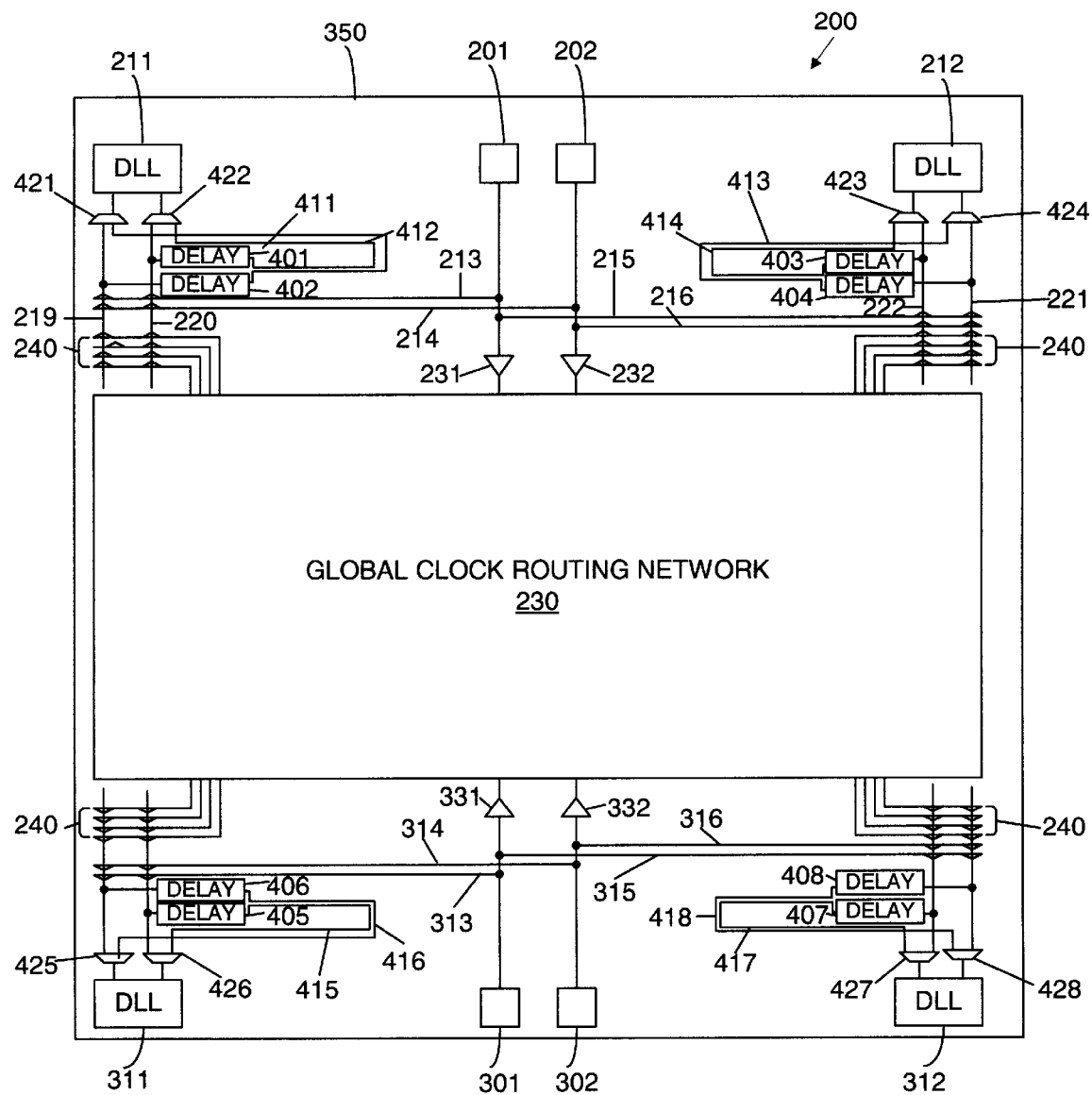
FIG. 3 is a schematic diagram illustrating the general layout of pads, DLLs, traces, a global clock routing network, and global clock drivers in accordance with one embodiment of the present invention.

FIG. 3 is a schematic diagram illustrating the general layout of FPGA 200, which includes pads 201–202 and 301–302, DLLs 211–212 and 311–312, traces 213–216, 219–222, and 313–316, global clock routing network 230, global clock drivers 231–232 and 331–332, adjustable delay circuits 401–408, delay traces 411–418, and multiplexers 421–428. Because the upper half of FPGA 200 is substantially identical to the lower half of FPGA 200, only the upper half of FPGA 200 is described in detail.

As illustrated in FIG. 3, pads 201 and 202 are centrally located along one edge 350 of FPGA 200, and DLLs 211 and 212 are located near the ends of this edge 350. Thus, traces 213–216, which extend between pads 201–202 and DLLs 211–212, have lengths that are approximately equal to half the width of FPGA 200. As a result of these relatively long traces 213–216, signals passing from pads 201–202 to DLLs 211–212 can experience a significant delay. Moreover, this delay is dependent upon the size of FPGA 200. That is, longer signal delays exist for larger FPGAs.

Adjustable delay circuits 401–404 and delay traces 411–414 are provided to compensate for the delays introduced by traces 213–216. In the described embodiment, each of delay traces 411–414 extends from the ends of edge 350 toward the center of edge 350 for a distance approximately equal to one quarter of the width of FPGA 200. From this location, delay traces 411–414 are then routed back to the ends of edge 350 as illustrated. As a result, delay traces 411–414 are approximately the same length as traces 213–216. Traces 213–216 and delay traces 411–414 are designed to have the same width. In addition, traces 213–216 and delay traces 411–414 are driven with drivers having the same size. Note that traces 213–216 are driven by drivers located at the ends of these traces closest to pads 201–202. Traces 411–414 are driven by drivers located in adjustable delay circuits 401–404, respectively. Moreover, these drivers drive substantially similar loads. As a result, delay traces 411–414 introduce approximately the same delay as traces 213–216. Advantageously, the delays introduced by traces 213–216 and 411–414 scale equally irrespective of the size of FPGA 200. As a result, the delays introduced by traces 213–216 and 411–414 are approximately equal regardless of the size of FPGA 200.

Adjustable delay circuits 401–404 are connected in series with traces 411–414, respectively. Each of adjustable delay circuits 401–404 includes a plurality of buffers, each of which introduces a pre-determined signal delay. In a particular embodiment, each of adjustable delay circuits 401–404 includes eight buffers. Each of the adjustable delay circuits can be configured to connect a selectable number of buffers in series. For example, adjustable delay circuit 401 can be configured to connect five buffers in series, while leaving three buffers disconnected. Controlling the number of series-connected buffers controls the delay introduced by adjustable delay circuits 401–404. Thus, adjustable delay circuits 401–404 are configured to adjust the total delay introduced by the paths that include delay traces 411–414, respectively. Adjusting the total delay in this manner enables DLL circuits 211 and 212 to eliminate any skew between clock signals applied to pads 201–202 and the resulting clock signals arriving at the end of global clock network 230.

Multiplexer 421 is configured to selectively connect delay trace 412 or trace 219 to the CLK_FB input terminal of DLL 211. Multiplexer 422 is configured to selectively connect delay trace 411 or trace 220 to the CLK_IN input terminal of DLL 211. Multiplexers 423 and 424 are configured in a similar manner.

Global clock drivers 231 and 232 are located near pads 201 and 202 at the center of edge 350. This placement advantageously allows clock signals applied to pads 201 and 202 to be routed along a relatively direct path to global clock drivers 231 and 232, without the delay introduced by traces 213–216, when DLLs 211–212, 311–312 are not used.

Figure 1:
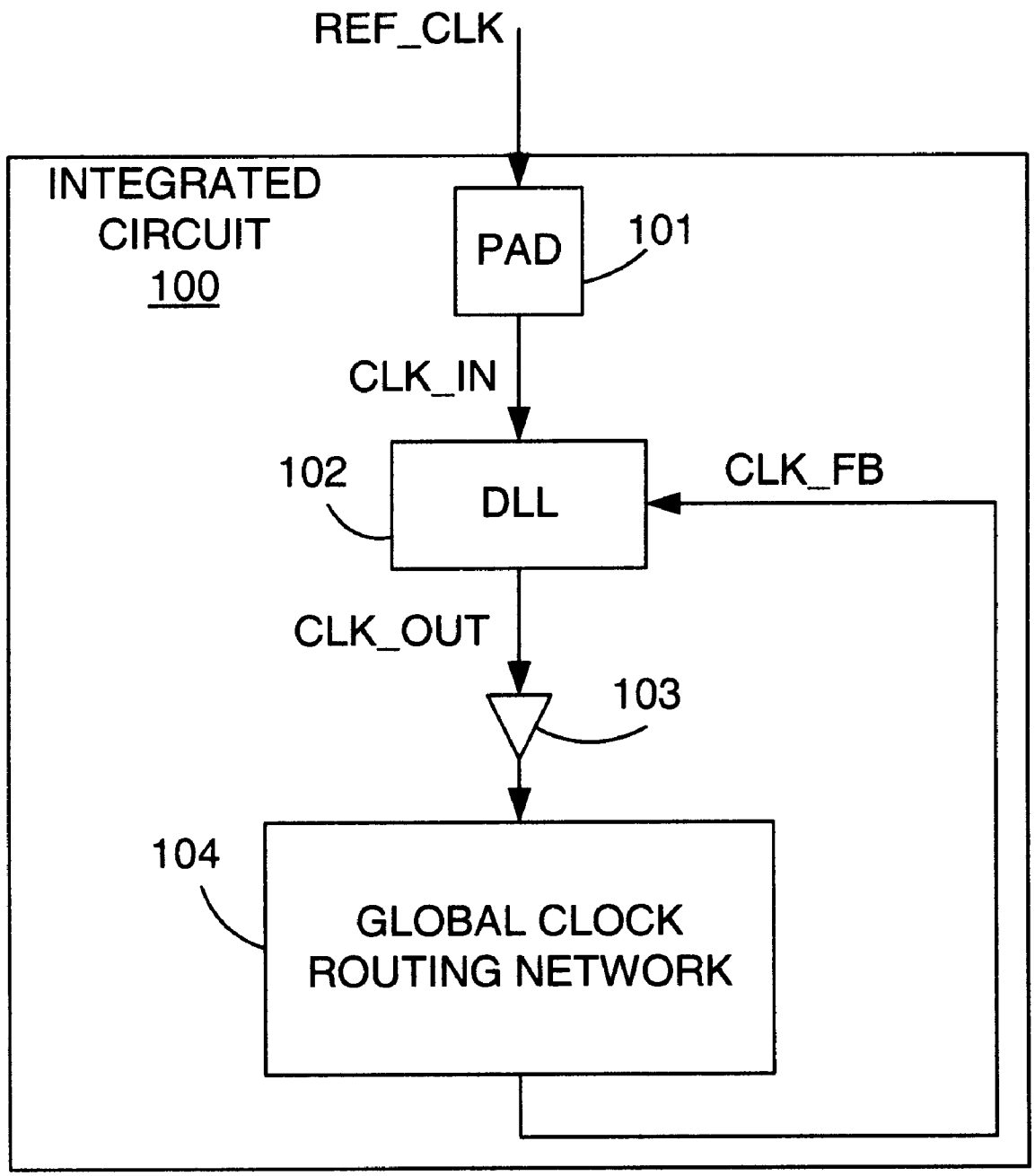
FIG. 1 is a block diagram of a delay locked loop (DLL) of a conventional FPGA.

In accordance with the present invention, FPGA 200 can be configured to operate in various ways. For example, FPGA 200 can be configured to operate in the same manner as prior art integrated circuit 100 (FIG. 1). To achieve this configuration, the PIPs of FPGA 200 are programmed such that pad 201 is connected to the CLK_IN terminal of DLL 211 through trace 213 and multiplexer 422. A reference clock signal is applied to pad 201 and routed to DLL 211 as the CLK_IN signal. DLL 211 is programmed to generate the CLK_0 output signal in response to the CLK_IN signal. The PIPs are further programmed to route the CLK_0 output signal to global clock driver 231 (PIPs and traces not shown in FIG. 3). From global clock driver 231, the CLK_0 output signal is routed through global clock routing network 230 and provided to the CLK_FB input terminal of DLL 211 through multiplexer 421. The resulting circuit is equivalent to the circuit described above in connection with FIG. 1. Although this circuit has been described in connection with pad 201, DLL 211, and global clock driver 231, it is understood that equivalent circuits can be obtained using various combinations of pads 201–202, 301–302, DLLs 211–212, 311–312, and global clock drivers 231–232, 331–332.

Alternatively, FPGA 200 can be configured to operate as a clock mirror circuit. To achieve this configuration, the PIPs of FPGA 200 are programmed such that pad 201 is connected to the CLK_IN terminal of DLL 211. A reference clock signal is applied to pad 201 and routed to DLL 211 as the CLK_IN signal. DLL 211 is programmed to generate the CLK_0 output signal. The PIPs are further programmed to route the CLK_0 output signal to horizontal long lines 250 or general hex lines 280. From horizontal long lines 250 or general hex lines 280, the CLK_0 signal is routed to an output driver (not shown) of FPGA 200. From this output driver, the CLK_0 signal is routed to all of the devices mounted on a printed circuit board (i.e., the same circuit board on which FPGA 200 is mounted).

The CLK_0 signal is also routed from the output driver to pad 202, via a trace on the printed circuit board. The PIPs of FPGA 200 are further programmed such that pad 202 is connected to the CLK_FB input terminal of DLL 211. As described above, the delays from pads 201 and 202 to DLL 211 are matched. As a result, DLL 211 forces the clock signals received on pads 201 and 202 to be synchronized. That is, the clock signal applied to pad 201 is mirrored to pad 202 and the rest of the board. As a result, the reference clock signal is advantageously only loaded by one pad (i.e., pad 201). In the case where the reference clock signal is driven by a relatively weak driver circuit, FPGA 200 can advantageously re-buffer the reference clock signal, thereby driving a relatively strong clock signal to the rest of the printed circuit board. Note that because the reference clock and the feedback clock are each provided to one of input pads 201–202, the adjustable delay circuits 401–404 and delay traces 411–414 are not used in this configuration.

In the clock mirror embodiment, the PIPs of FPGA 200 can also be configured to route the clock signal received on pad 202 to the CLK_IN terminal of DLL 212. DLL 212 can then be used to generate a clock signal that is used internally by FPGA 200.

In another embodiment of the present invention, the output clock signal generated by DLL 211 is distributed on horizontal long lines 250 and backbone hex lines 270, rather than by global clock drivers 231–232 and global clock routing network 230. As described by Young et al in commonly owned, co-pending U.S. patent application Ser. No. 08/806,997, referenced above, horizontal long lines 250 and backbone hex lines 270 can be programmably connected to provide a low skew, high fan-out network for transmission of common signals throughout FPGA 200. However, horizontal long lines 250 and backbone hex lines 270 introduce more delay to the distributed clock signal than global clock routing circuitry 230. To help compensate for this additional delay, the CLK_FB signal is routed to DLL 211 from backbone hex lines 270. In a particular embodiment, the CLK_FB signal is created by routing the distributed clock signal from backbone hex lines 270 to vertical long lines 260, and from vertical long lines 260 to trace 219 by programming the appropriate PIPs. As a result, the CLK_FB signal exhibits approximately the same delay as the distributed clock signal, thereby allowing DLL 211 to generate a more accurate output clock signal.

In yet another embodiment, a reference clock signal is applied to pad 201 and routed to the CLK_IN terminal of DLL 211. In this embodiment, DLL 211 is configured to generate output clock signal CLK_2X, which has a frequency that is twice the frequency of the clock signal applied to the CLK_IN terminal. As a result, DLL 211 provides an output clock signal CLK_2X having a frequency twice the frequency of the reference clock signal. Note that adjustable delay circuit 401 and delay trace 411 (or adjustable delay circuit 402 and delay trace 412) are used in this embodiment because only the reference clock signal is received on a pad (pad 201). The output clock signal CLK_2X is routed from DLL 211 to the CLK_IN terminal of DLL 212 on either horizontal long lines 250 or general hex lines 280 by programming the appropriate PIPS. DLL 212 is also configured to generate output clock signal CLK_2X, which has a frequency that is twice the frequency of the clock signal applied to the CLK_IN terminal. As a result, the output clock signal CLK_2X generated by DLL 212 has a frequency four times the frequency of the reference clock signal. In this manner, one clock signal can be constructed from another clock signal on FPGA 200. Note that this process can continue with the remaining two DLLs (311–312) of FPGA 200. Also note that adjustable delay circuits 403–404 and delay traces 413–414 are not used in this embodiment because the clock signal received by DLL 212 is not received from a pad. The above-described ability advantageously increases the number of clock signals that can be generated on FPGA 200.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A field programmable gate array (FPGA), comprising:
   a first pad;
   a first delay locked loop;
   a first global clock driver;
   general interconnect circuitry; and
   programmable connections selectively connecting the first pad to the first delay locked loop, the first global clock driver, and the general interconnect circuitry.

2. The FPGA of claim 1, further comprising:
   a second pad; and
   a second delay locked loop;
   wherein the programmable connections further selectively connect the second pad to the first delay locked loop, the second delay locked loop, the first global clock driver, and the general interconnect circuitry.

3. The FPGA of claim 2, wherein the programmable connections further selectively connect the first pad to the second delay locked loop.

4. The FPGA of claim 1, further comprising an array of configurable logic blocks (CLBs), wherein the general interconnect circuitry comprises horizontal long lines extending along the array of CLBs along a first axis, and vertical long lines extending along the array of CLBs along a second axis.

5. The FPGA of claim 4, wherein the general interconnect circuitry further comprises hex lines, each of the hex lines extending across six gaps between adjacent CLBs.

6. The FPGA of claim 2, wherein the first and second delay locked loops each comprise a clock input terminal and a feedback input terminal, and wherein the programmable connections comprise programmable connections located between the first and second pads and the clock input terminals, and programmable connections located between the first and second pads and the feedback input terminals.

7. The FPGA of claim 2, further comprising programmable connections located between one or more output terminals of the first delay locked loop and an input terminal of the second delay locked loop.

8. The FPGA of claim 2, wherein the first and second pads are centrally located along an edge of the FPGA, and the first and second delay locked loops are located at opposite ends of the edge.

9. The FPGA of claim 2, further comprising a second global clock driver, and wherein the programmable connections further selectively connect at least one of the first pad and the second pad to the first global clock driver and the second global clock driver.

10. The FPGA of claim 9, wherein the programmable connections further selectively connect at least one of the first delay locked loop and the second delay locked loop to the first global clock driver and the second global clock driver.

11. The FPGA of claim 9, further comprising a global clock routing network connected to the first and second clock drivers, the global clock routing network being formed to distribute clock signals throughout the FPGA.

12. The FPGA of claim 11, wherein:
   the first delay locked loop has a first feedback input terminal;
   the second delay locked loop has a second feedback input terminal; and
   the programmable connections further selectively connect the global clock routing network and the first and second feedback input terminals.

13. A field programmable gate array (FPGA), comprising:
   a first pad;
   a first delay locked loop;
   a first trace extending between the first pad and the first delay locked loop, the first trace exhibiting a first delay;
   a global clock routing network for receiving and distributing an input clock signal; and
   a second trace extending between the global clock routing network and the first delay locked loop, the second trace exhibiting a second delay, wherein the first delay is equal to the second delay.

14. The FPGA of claim 13, wherein the first pad is located near a mid-point of an edge of the FPGA, and the first delay locked loop is located near an end of the edge.

15. The FPGA of claim 14, wherein the first trace extends between the mid-point and the end of the edge, and wherein the second trace extends from the end of the edge half way toward the mid-point and then extends back to the end of the edge.

16. The FPGA of claim 13, further comprising an adjustable delay circuit connected in series with the second trace.

17. A method of operating a field programmable gate array (FPGA) comprising the steps of:
   routing a reference clock signal from a first pad to a first delay locked loop on the FPGA;
   generating a first output clock signal with the first delay locked loop;
   transmitting the first output clock signal off of the FPGA;
   receiving the first output clock signal on a second pad of the FPGA;
   routing the first output clock signal from the second pad to the first delay locked loop as a feedback clock signal; and
   introducing a delay to the first output clock signal with the first delay locked loop, the delay being selected such that the first output clock signal on the second pad matches the reference clock signal on the first pad.

18. The method of claim 17, further comprising the steps of:
   routing the first output clock signal from the second pad to a second delay locked loop on the FPGA; and
   generating a second output clock signal in response to the first output clock signal with the second delay locked loop.

19. A method of operating a field programmable gate array (FPGA), the method comprising the steps of:
   routing a reference clock signal from a first pad to a first delay locked loop on the FPGA;
   generating a first output clock signal with the first delay locked loop;
   routing the first output clock signal from the first delay locked loop to a second delay locked loop on the FPGA; and
   generating a second output clock signal with the second delay locked loop.

* * * * *